(12) United States Patent
Elliot et al.

(10) Patent No.: US 7,098,428 B1
(45) Date of Patent: Aug. 29, 2006

(54) SYSTEM AND METHOD FOR AN IMPROVED SUSCEPTOR

(76) Inventors: Brent Elliot, 22353 Riverside Dr., Cupertino, CA (US) 95014; Frank Balma, 15995 Greenwood Rd., Monte Sereno, CA (US) 95030; Alexander Veytser, 1429 Lloyd Way, Mountain View, CA (US) 94040; Benjamin Mosser, 13573 Freeport Rd., San Diego, CA (US) 92129; Harold H. Mortensen, 3336 Bajo Ct., Carlsbad, CA (US) 92009

(*) Notice: Subject to any disclaimer, the term of this patent is extended or adjusted under 35 U.S.C. 154(b) by 0 days.

(21) Appl. No.: 11/044,153

(22) Filed: Jan. 26, 2005

Related U.S. Application Data

(60) Provisional application No. 60/542,175, filed on Apr. 4, 2004.

(51) Int. Cl.
*H05B 3/68* (2006.01)
*C23C 16/00* (2006.01)
(52) U.S. Cl. .................................. 219/444.1; 118/724
(58) Field of Classification Search ............ 219/443.1, 219/444.1, 541, 542, 543, 544, 546, 547, 219/548; 118/424, 425, 428, 429, 621; 427/569, 427/578, 587, 592
See application file for complete search history.

(56) References Cited

U.S. PATENT DOCUMENTS

| | | | | |
|---|---|---|---|---|
| 5,306,895 A | * | 4/1994 | Ushikoshi et al. | .......... 219/385 |
| 5,817,406 A | * | 10/1998 | Cheung et al. | ............. 428/210 |
| 6,080,970 A | * | 6/2000 | Yoshida et al. | .......... 219/444.1 |
| 6,358,573 B1 | * | 3/2002 | Raoux et al. | ................ 427/578 |

* cited by examiner

*Primary Examiner*—Sang Paik
(74) *Attorney, Agent, or Firm*—Carr & Ferrell LLP

(57) ABSTRACT

A susceptor including a substrate support and a conductor is provided. The substrate support includes a conductive element, a contact bonded to the conductive element, and a bushing. The conductor is disposed through the bushing and is bonded to the contact. The substrate support can also include a conductive spreader between the contact and the conductive element. A method for fabricating a susceptor is also provided. The method comprises forming a plate including a bushing preform, sintering or hot-pressing a conductive element and a contact between a ceramic layer and the plate to produce a substrate support, forming a conductor opening into the substrate support and through the bushing preform to the contact, and bonding a conductor into the conductor opening.

20 Claims, 10 Drawing Sheets the contact 302 and an interior wall of the hole 202 and corrode the braze material 310. It will be appreciated that in many instances both failure mechanisms contribute to the ultimate failure.

Therefore, what is needed is a susceptor with internal electrical connections that are better able to withstand mechanical stresses and corrosive environments.

SYSTEM AND METHOD FOR AN IMPROVED SUSCEPTOR

CROSS-REFERENCE TO RELATED APPLICATIONS

This application claims the benefit of U.S. Provisional Patent Application Ser. No. 60/542,175, filed Feb. 4, 2004, entitled "System and Method for an Improved Susceptor," which is incorporated herein by reference in its entirety.

BACKGROUND OF THE INVENTION

1. Field of the Invention

The present invention relates generally to the field of semiconductor fabrication, and more particularly to a susceptor for securing a wafer in a processing chamber.

2. Description of the Prior Art

Semiconductor processing and similar manufacturing processes typically employ thin film deposition techniques such as Chemical Vapor Deposition (CVD). In CVD processing, as well as in similar manufacturing techniques, a substrate such as a silicon wafer is secured within a processing chamber by a susceptor and exposed to the particular processing conditions of the process. The susceptor is essentially a pedestal that, in addition to securing the substrate, can in some instances also be used to heat the substrate.

FIGS. 1–3 illustrate a representative series of fabrication steps for forming a susceptor according to the prior art. In FIG. 1, conductive elements 102 are set between layers 104 of a ceramic material, such as AlN. The conductive elements 102 can be, for example, a heating element and a static plate for maintaining an electrostatic field. Conductive elements 102 have to be electrically connected to, for example, power supplies and voltage sources, and towards this end, each conductive element 102 includes an electrical contact 106. Once the conductive elements 102 with their respective electrical contacts 106 have been set between layers 104 of the ceramic material, the entire assembly is sintered or hot-pressed to form a substrate support 108.

Once the substrate support 108 has been sintered, a hole 202 is machined into the substrate support 108 to create access to the electrical contact 106 of each conductive element 102. Typically, the hole 202 includes a threaded surface. Next, as shown in FIG. 3, a contact 302 is threaded into the hole 202 and brazed to the electrical contact 106. A support shaft 304 is also coupled to a bottom surface of the substrate support 108. The support shaft 304 serves to both elevate the substrate within a processing chamber as well as to act as a conduit for electrical connectors such as the contact 302. Accordingly, an extension rod 306 of the contact 302 extends through the support shaft 304 to electrically connect to a voltage or power supply (not shown) of the processing chamber.

Through extended use, deficiencies in the connection of the contact 302 to the conductive element 102 have come to light. In particular, a braze material 310 that connects the contact 302 to the electrical contact 106 is a weak point that is prone to fail. Two common failure mechanisms include mechanical failure and corrosive failure. Mechanical failure can occur due to various sources of stress. For example, repeated coupling and decoupling of the extension rod 306 to the voltage or power supply of the processing chamber can transfer stresses to the braze material 310. Additional stresses are created by repeated heating and cooling cycles. Corrosive failure occurs when corrosive process gases, such as chlorine, fluorine, and oxygen, migrate between the

SUMMARY

The present invention provides a susceptor for use in a processing chamber, such as a CVD processing chamber. The susceptor comprises a substrate support, a support shaft joined to the substrate support, and a conductor. The substrate support comprises an insulating body, a conductive element disposed within the insulating body, a contact disposed within the insulating body and in electrical communication with the conductive element, and a bushing disposed within the insulating body such that the contact is disposed between the bushing and the conductive element. The conductor is in electrical communication with the contact of the substrate support and extends through both the bushing and the support shaft. In some embodiments, the substrate support further comprises a conductive spreader disposed between the contact and the conductive element. In some embodiments, the conductor is brazed to the contact and/or to the bushing and/or to the insulating body.

The insulating body can be formed, for example, of a ceramic such as AlN. The conductive element can comprise, for instance, a heating element, an RF grid, or an electrostatic electrode. The contact can comprise a cylinder or a ring. In some embodiments, the contact is diffusion bonded to the conductive element. The bushing can comprise a plate-like member with a bore therethrough for receiving the conductor. The bushing can comprise a shape that is non-circular, such as a hexagon. The conductive element, the contact, and the bushing can each be formed, for example, of materials such as molybdenum, tungsten, or other materials having coefficients of thermal expansion similar to that of the insulating body.

The present invention also provides a substrate support for a susceptor comprising an insulating body, a conductive element disposed within the insulating body, an electrical contact disposed within the insulating body, and a conductive spreader disposed within the insulating body and providing electrical communication between the electrical contact and the conductive element. The conductive spreader can include spokes or apertures. The conductive spreader can be formed, for example, of materials such as molybdenum, tungsten, or other materials having coefficients of thermal expansion similar to that of the insulating body.

The present invention further provides a method of fabricating a susceptor. The method comprises producing a plate including sintering or hot-pressing a bushing preform between first and second electrically insulating material layers, sintering or hot-pressing a conductive element and a contact between a third electrically insulating layer and the plate such that the contact is disposed between the bushing preform and the conductive element, forming a conductor opening through the bushing preform and to the contact, and bonding a conductor into the conductor opening. The method can further comprise sintering or hot-pressing a conductive spreader between the contact and the conductive element.

Producing the plate, in some embodiments, further includes forming a contact opening into the first electrically insulating material layer. Producing the plate can further include forming a bushing opening into the first electrically insulating material layer or the second electrically insulating material layer. Forming the conductor opening can include machining, and can also include machining through the bushing preform and at least partially into the contact.

DETAILED DESCRIPTION OF THE INVENTION

Figure 4:
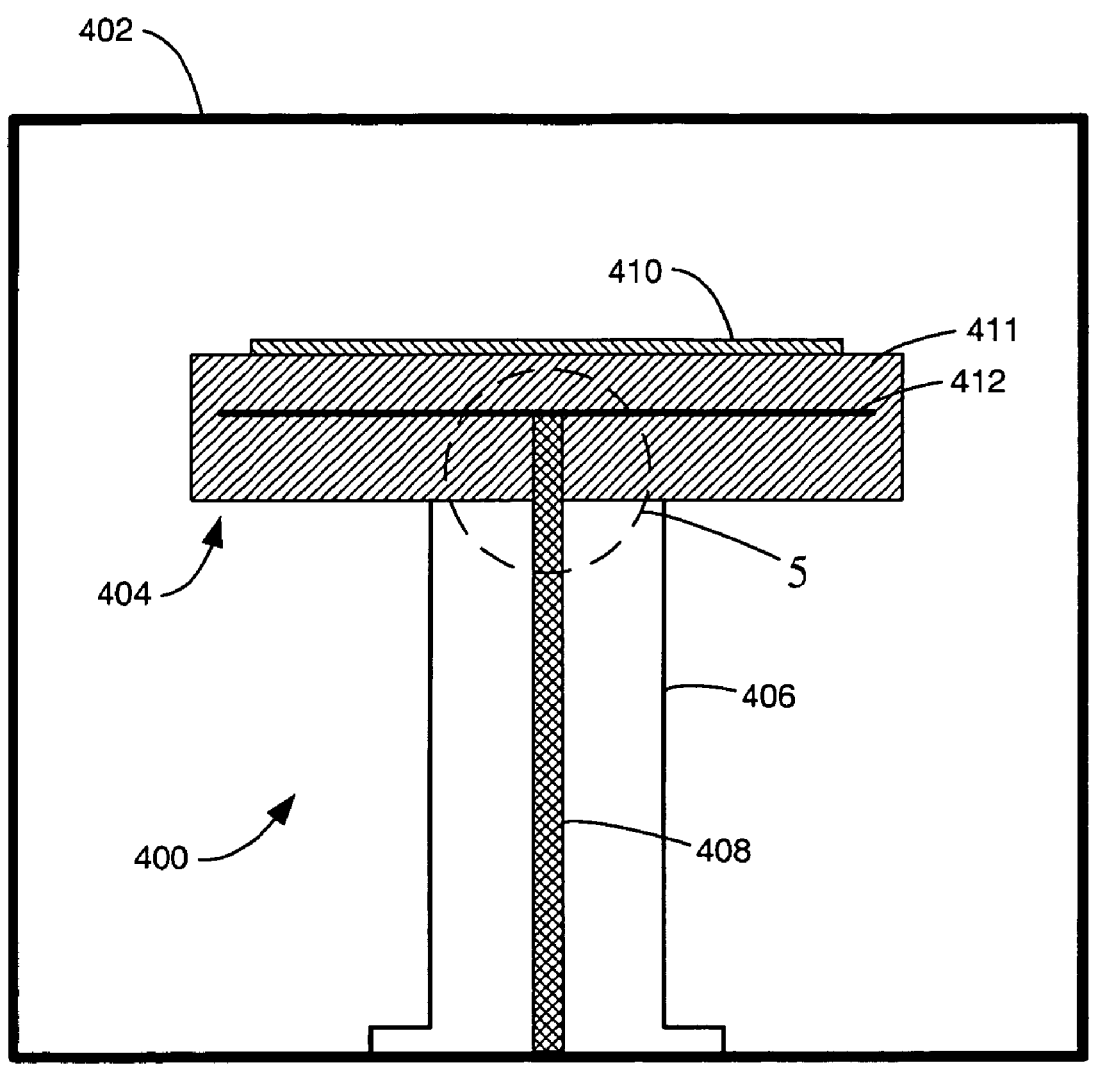
FIG. 4 shows a cross-section of a susceptor according to an exemplary embodiment of the present invention.

FIG. 4 is a cross-section of a susceptor 400, according to an exemplary embodiment of the present invention, set inside a processing chamber 402, such as a CVD chamber. The susceptor 400 includes a substrate support 404 joined to a support shaft 406, and a conductor 408 extending from the substrate support 404 through the support shaft 406.

The substrate support 404 is configured to secure a substrate 410, such as a silicon wafer. The substrate support 404 includes an insulating body 411 and one or more electrically conductive elements 412 disposed within the insulating body 411. The conductive element 412 can be, for example, a heating element, an RF grid, or an electrostatic electrode. Accordingly, an electric current applied to a conductive element 412 that is a heating element will heat the substrate support 404 which, in turn, will heat the substrate 410. A voltage applied to a conductive element 412 that is an electrostatic electrode can bias a top surface of the substrate support 404 to electrostatically secure the substrate 410. The insulating body 411 is preferably made of a material that can withstand the processing conditions within the processing chamber 402. Ceramic materials, such as aluminum nitride (AlN), work well for use in the processing chamber 402.

The support shaft 406 is a hollow member that both elevates the substrate 410 within the processing chamber 402 and provides a conduit for electrical connections to the one or more conductive elements 412. The support shaft 406 preferably includes a flange for securing the support shaft 406 to the floor of the processing chamber 402. Like the substrate support 404, the support shaft 406 is preferably made of a material that can withstand the processing conditions within the processing chamber 402. In some embodiments, the support shaft 406 is made of the same material as the substrate support 404. The support shaft 406 can be joined to the substrate support 404, for instance, by a sintering process such as hot pressing.

The conductor 408 includes a first end that is connected to the conductive element 412, as described in more detail below, and a second end that is configured to connect to a power supply or voltage source (not shown) of the processing chamber 402. The second end of the conductor 408 is preferably shaped to be able to engage an electrical receptacle (not shown) in the processing chamber 402 that is in electrical communication with the power supply or voltage source. The shape of the second end of the conductor 408 is preferably a standard connector shape such as a banana jack. The conductor 408 is preferably made from an electrically conductive material that has good resistance to the processing gases within the processing chamber 402. Suitable materials include nickel (Ni), molybdenum (Mo), and tungsten (W). The conductor 408 can be either a solid or a hollow rod. Since the conductor 408 disadvantageously conducts heat away from the substrate support 404 causing temperature non-uniformity at the wafer 410, the conductor 408 is preferably hollow in order to reduce its capacity to conduct heat away.

Figure 5:
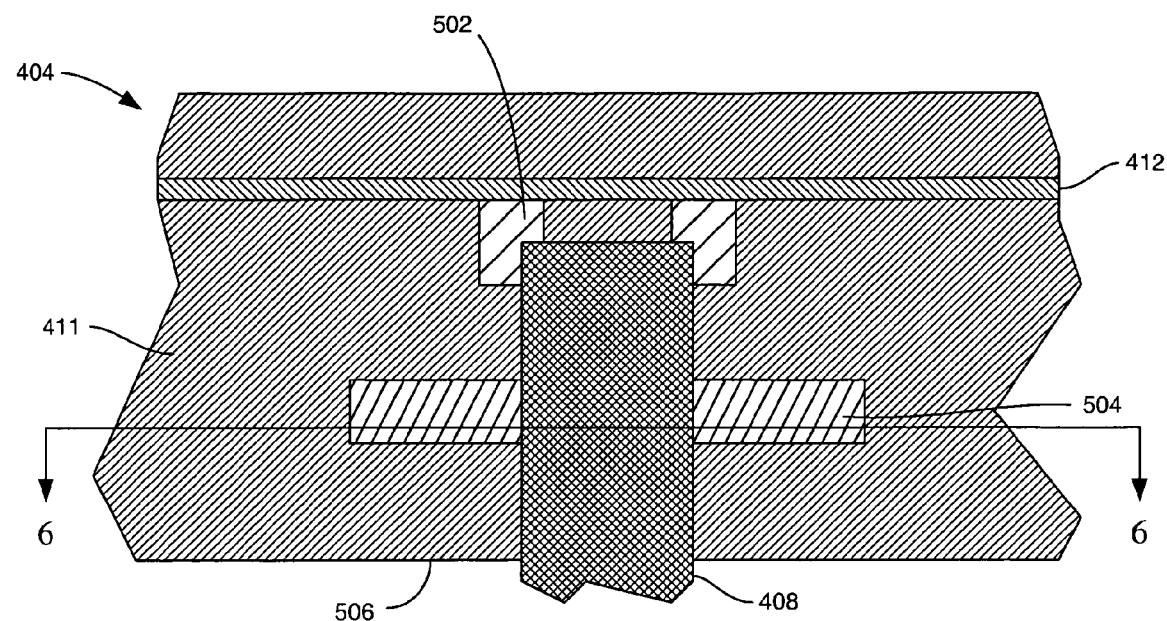
FIG. 5 shows an enlarged cross-sectional view of the connection of a conductor to a conductive element within the circled region 5 of FIG. 4.

FIG. 5 shows an enlarged cross-sectional view of the connection of the conductor 408 to the conductive element 412 within the substrate support 404 in the circled region 5 of FIG. 4. It can be seen from FIG. 5 that the substrate support 404 includes a contact 502 and a bushing 504 both disposed within the insulating body 411. The shape of the contact 502, in some embodiments, is a disk, cylinder, tube, or ring. Shapes that include a central hole or bore, such as a cylinder, are preferable to promote ceramic bonding therethrough and to reduce the capacity of the contact 502 to conduct heat to the conductor 408. In these embodiments, the same material that forms the insulating body 411 also preferably fills the volume enclosed by the contact 502. The contact 502 is preferably formed of an electrically conductive material with a coefficient of thermal expansion that is similar to that of the material of the insulating body 411. Where the insulating body 411 is formed of AlN, suitable materials for the contact 502 can be Mo, W, or other electrically conductive material with a similar coefficient of thermal expansion as AlN. The contact 502 is in electrical communication with the conductive element 412, and in some embodiments, the contact 502 is diffusion bonded to the conductive element 412.

Figure 6:
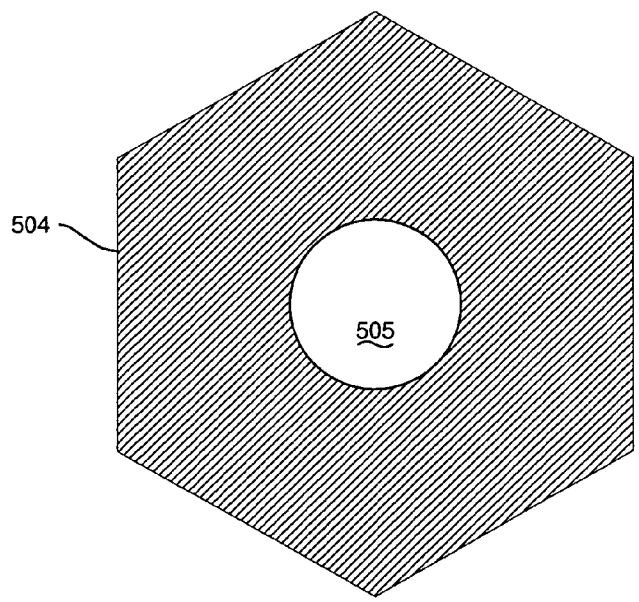
FIG. 6 shows a cross-sectional view of the bushing from the perspective 6—6 in FIG. 5.

FIG. 6 shows a cross-sectional view of the bushing 504 from the perspective 6—6 in FIG. 5. The bushing 504 is a plate-like member with a bore 505 therethrough having a sufficient diameter to receive the conductor 408 (FIG. 5). The bushing 504 can have essentially any shape including a circle, an oval, or a polygon such as a rectangle or a hexagon. Non-circular shapes can advantageously prevent the bushing 504 from rotating within the insulating body 411 in response to a torsional stress from the conductor 408. The bushing 504 is also preferably formed of a material with a coefficient of thermal expansion that is similar to that of the material of the insulating body 411 (FIG. 5). Where the insulating body 411 is formed of AlN, suitable materials for the bushing 504 likewise include Mo, W, and others. In some embodiments, the contact 502 (FIG. 5) and the bushing 504 are formed of the same material. The bushing 504 helps to relieve stresses in the conductor 408 to prevent those stresses from straining the bond between the conductor 408 and the contact 502. Accordingly, in some embodiments, the bushing 504 is disposed within the insulating body 411 roughly mid-way between the contact 502 and a bottom surface 506 of the substrate support 404.

Figure 1:
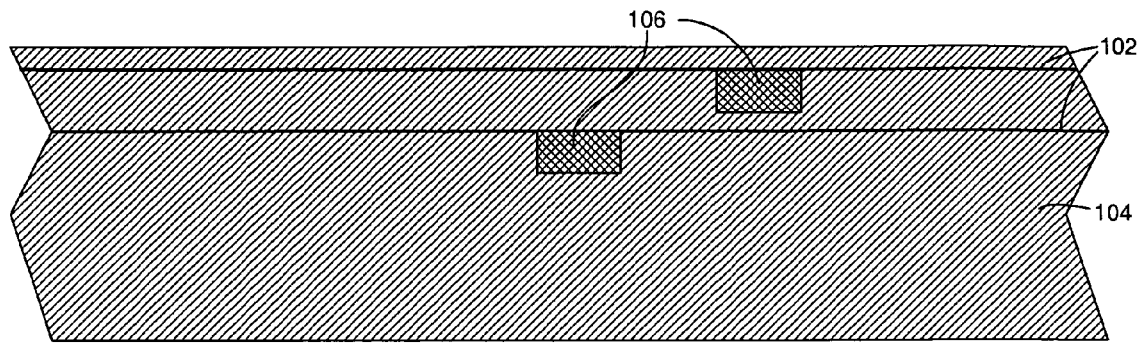
FIGS. 1–3 show a representative series of fabrication steps for forming a susceptor according to the prior art.
Figure 2:
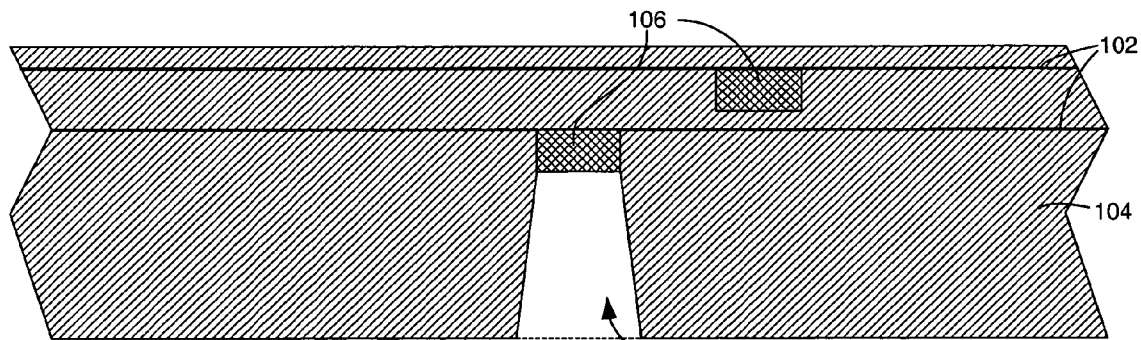
Figure 3:
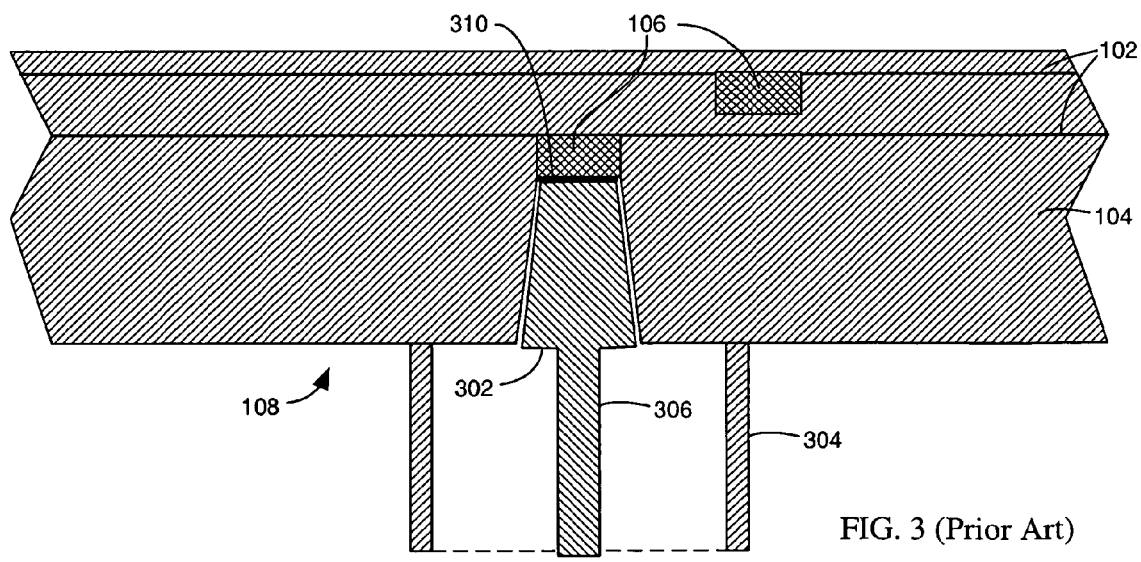
Figure 7:
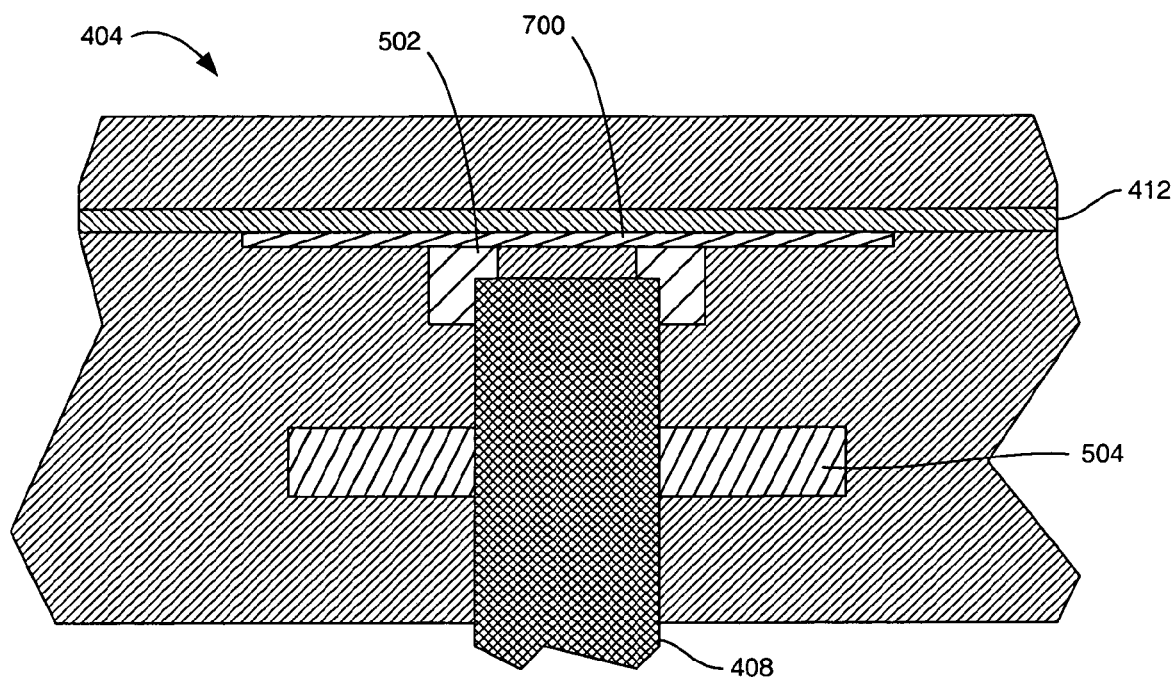
FIG. 7 shows a cross-sectional view of a connection of a conductor to a conductive element using a conductive spreader according to another exemplary embodiment of the present invention.

FIG. 7 shows a cross-sectional view of another exemplary embodiment of the connection of the conductor 408 to the conductive element 412 within the substrate support 404. In this embodiment, a conductive spreader 700 is disposed between the contact 502 and the conductive element 412 to increase the electrical contact area between the two. The conductive spreader 700 advantageously distributes electrical current or voltage more uniformly to the conductive element 412 for more uniform performance such as, for example, more uniform heating. The materials selection criteria for the conductive spreader 700 are essentially the same as for the other electrically conductive components of the substrate support 404. The conductive spreader 700 is preferably radially symmetric so that the distribution of the electrical current or voltage is also radially symmetric. In some embodiments, the conductive spreader 700 is a disk. Although the embodiment illustrated in FIG. 7 includes a contact 502 and a bushing 504, it will be readily appreciated that the conductive spreader 700 can also be placed between the conductive element 102 and the electrical contact 106 in the prior art susceptor of FIGS. 1–3.

Figure 8:
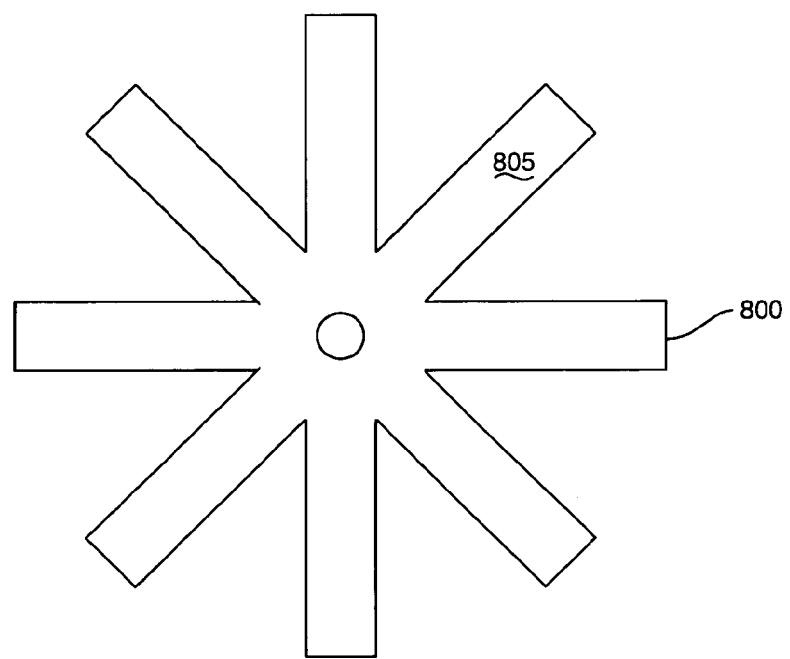
FIG. 8 shows a top view of a conductive spreader according to an exemplary embodiment of the present invention.
Figure 9:
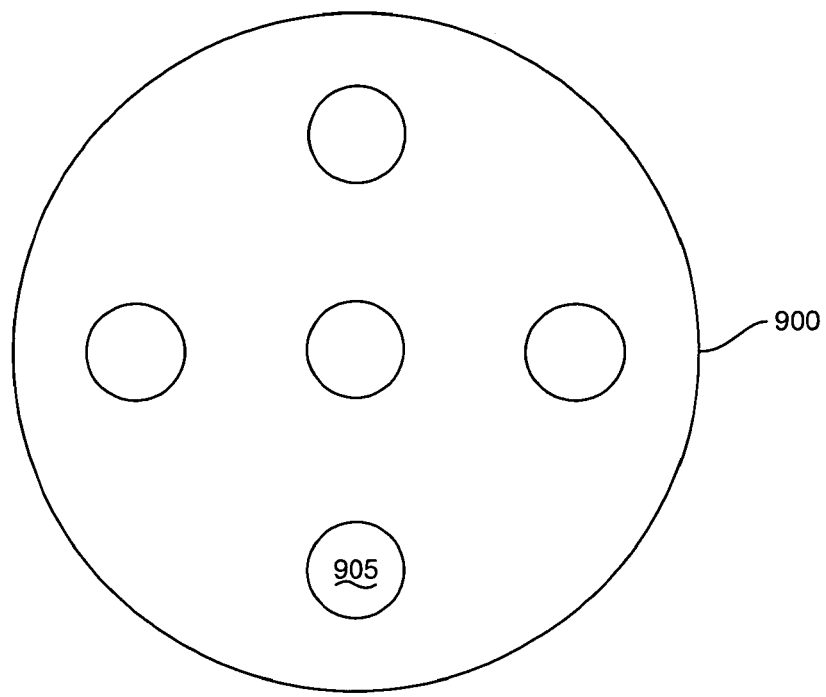
FIG. 9 shows a top view of a conductive spreader according to another exemplary embodiment of the present invention.
Figure 10:
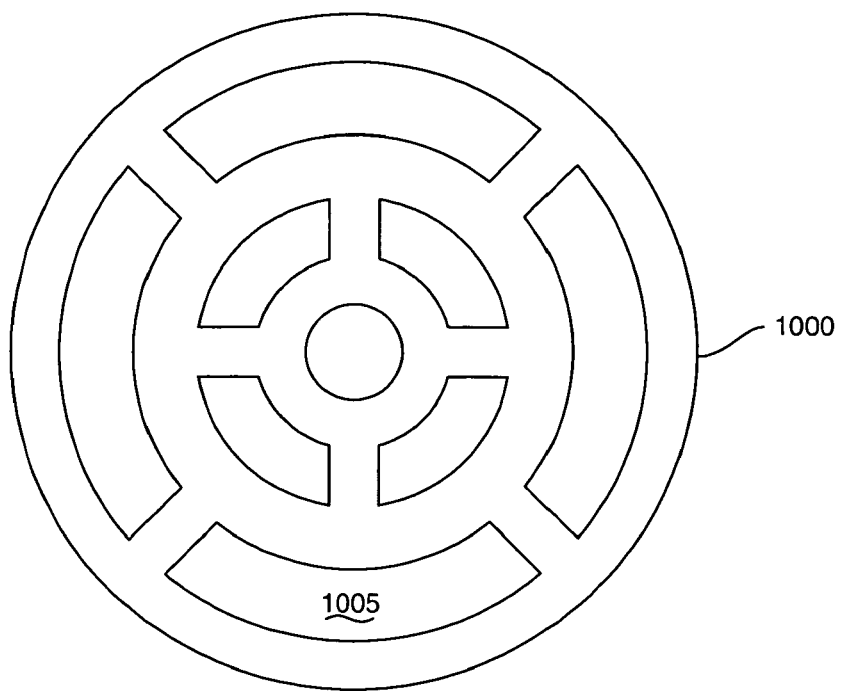
FIG. 10 shows a top view of a conductive spreader according to yet another exemplary embodiment of the present invention.

FIG. 8 shows a top view of an exemplary embodiment of a conductive spreader 800. In this embodiment, as well as the alternative embodiments 900 and 1000 shown in FIGS. 9 and 10, respectively, the conductive spreader 800 includes an open design for improved bonding to the insulating body 411 (FIG. 4). For the conductive spreader 800, the insulating body 411 is disposed between spokes 805. For the conductive spreaders 900 and 1000, the insulating body 411 is disposed within apertures 905 and 1005, respectively. The open designs of the conductive spreaders 800, 900, and 1000 also lessens the capacity of these components to conduct heat away from the substrate support 404 (FIG. 4) to the conductor 408 (FIG. 4), as noted elsewhere herein.

Figure 11:
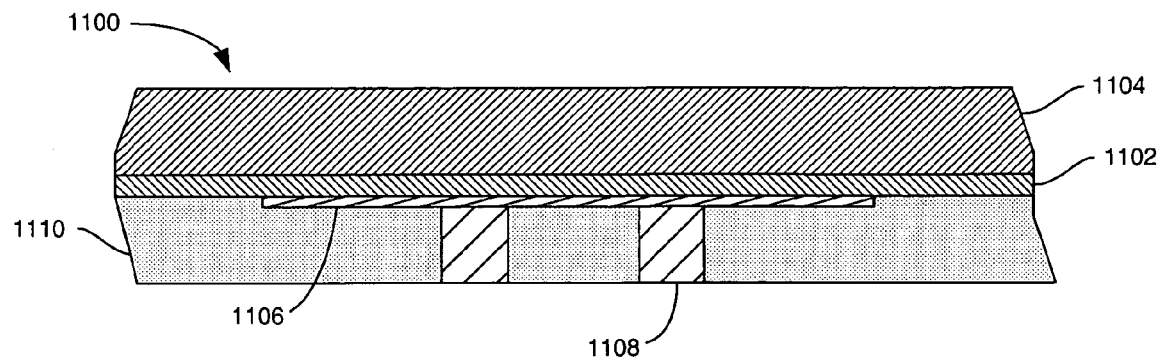
FIGS. 11–15 show manufacturing steps for producing a susceptor according to an exemplary embodiment of the present invention.

FIGS. 11–15 show exemplary manufacturing steps for producing a susceptor of the present invention. In FIG. 11 a first plate 1100 is produced. The first plate 1100 is made by placing a conductive element 1102 in contact with a first layer 1104 of an electrically insulating material, such as a ceramic like AlN. In some embodiments, such as the one illustrated in FIG. 11, a conductive spreader 1106 is placed in contact with the conductive element 1102 such that the conductive element 1102 is between the conductive spreader 1106 and the first layer 1104. A contact 1108 is placed in contact with the conductive spreader 1106, or in contact with the conductive element 1102 in those embodiments without the conductive spreader 1106. The space around the contact 1108 is filled with a powder 1110 of the electrically insulating material, and the entire assembly is sintered or hot-pressed to form the first plate 1100.

Placing the components 1102, 1106, and 1108 in contact can include joining the components 1102, 1106, and 1108 through, for instance, diffusion bonding, brazing, or welding. Brazing or welding can be performed prior to sintering. Diffusion bonding occurs between contacting components during sintering or hot-pressing.

Figure 12:
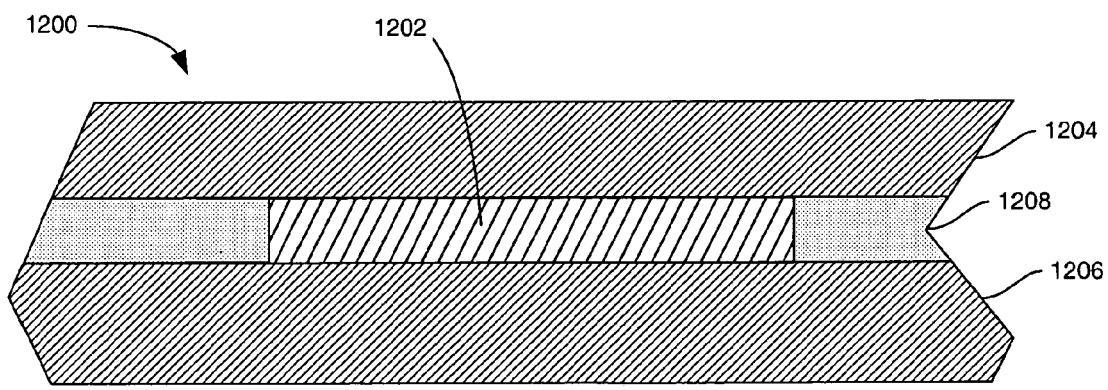

In FIG. 12 a second plate 1200 is produced. The second plate 1200 is made by placing a bushing preform 1202 between second and third layers 1204 and 1206 of an electrically insulating material, such as a ceramic like AlN. The space around the bushing preform 1202 is filled with a powder 1208 of the electrically insulating material and the entire assembly is sintered or hot-pressed to form the first plate 1200. The bushing preform 1202 is essentially the same as the bushing 504 (FIG. 5) without the bore 505 (FIG. 6).

Figure 13:
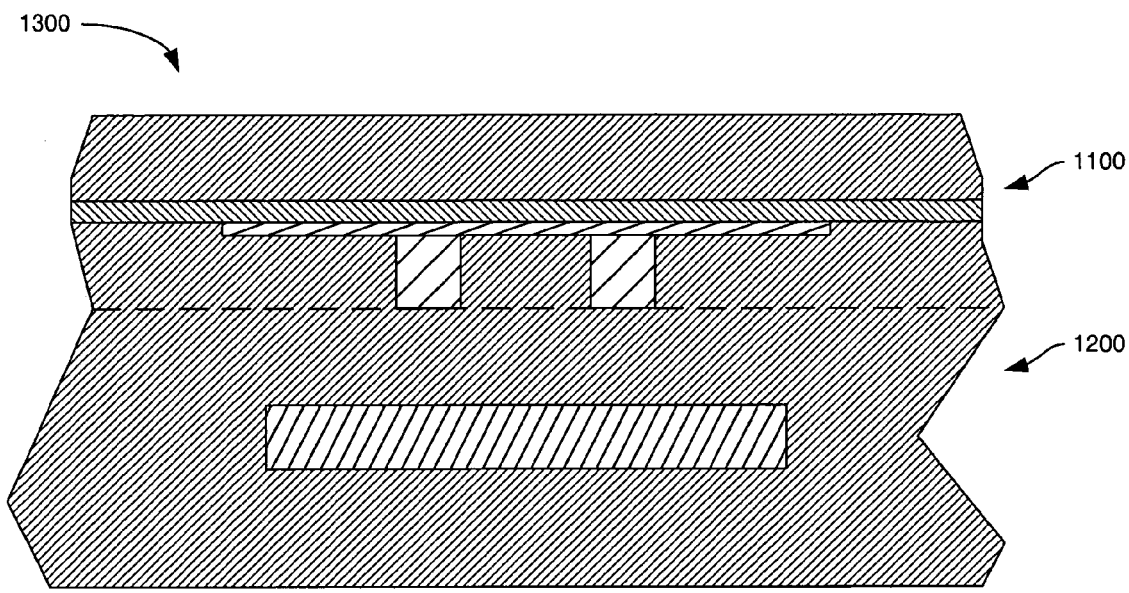
Figure 14:
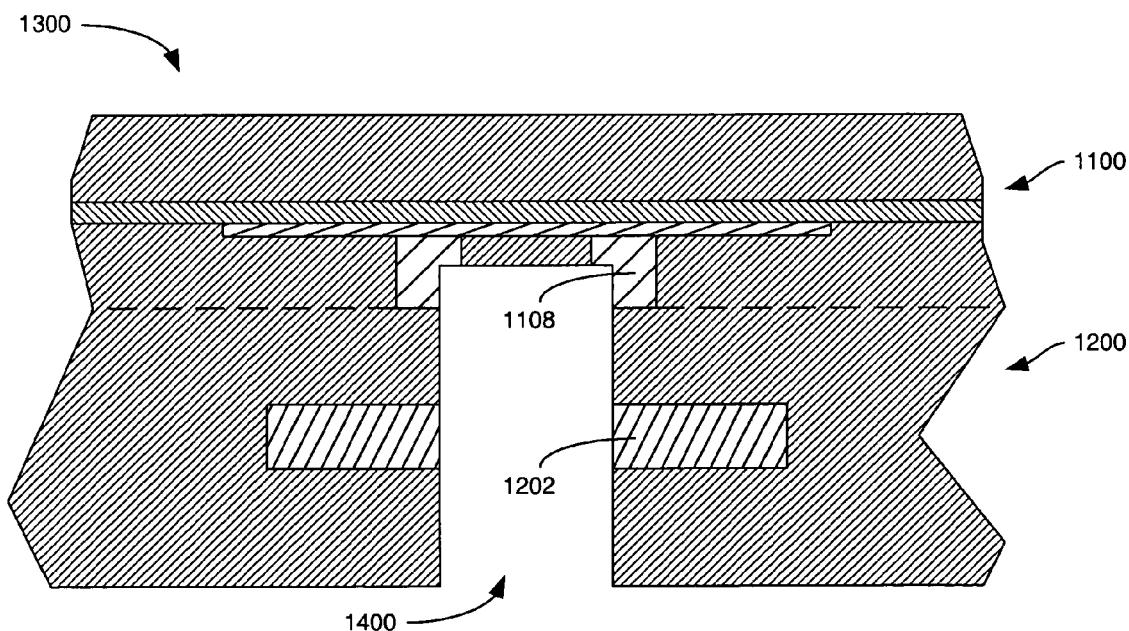

FIG. 13 shows a substrate support 1300 after plates 1100 and 1200 have been joined together, for example, by sintering or hot-pressing. FIG. 14 shows the substrate support 1300 after an opening 1400 has been formed, for example, by a machining operation such as drilling or grinding. The opening 1400 is disposed through the bushing preform 1202 to create a bore like the bore 505 (FIG. 5), thus completing a bushing like the bushing 504 (FIG. 5). The opening extends to the contact 1108, and preferably extends partially into the contact 1108 as shown in FIG. 14.

Figure 15:
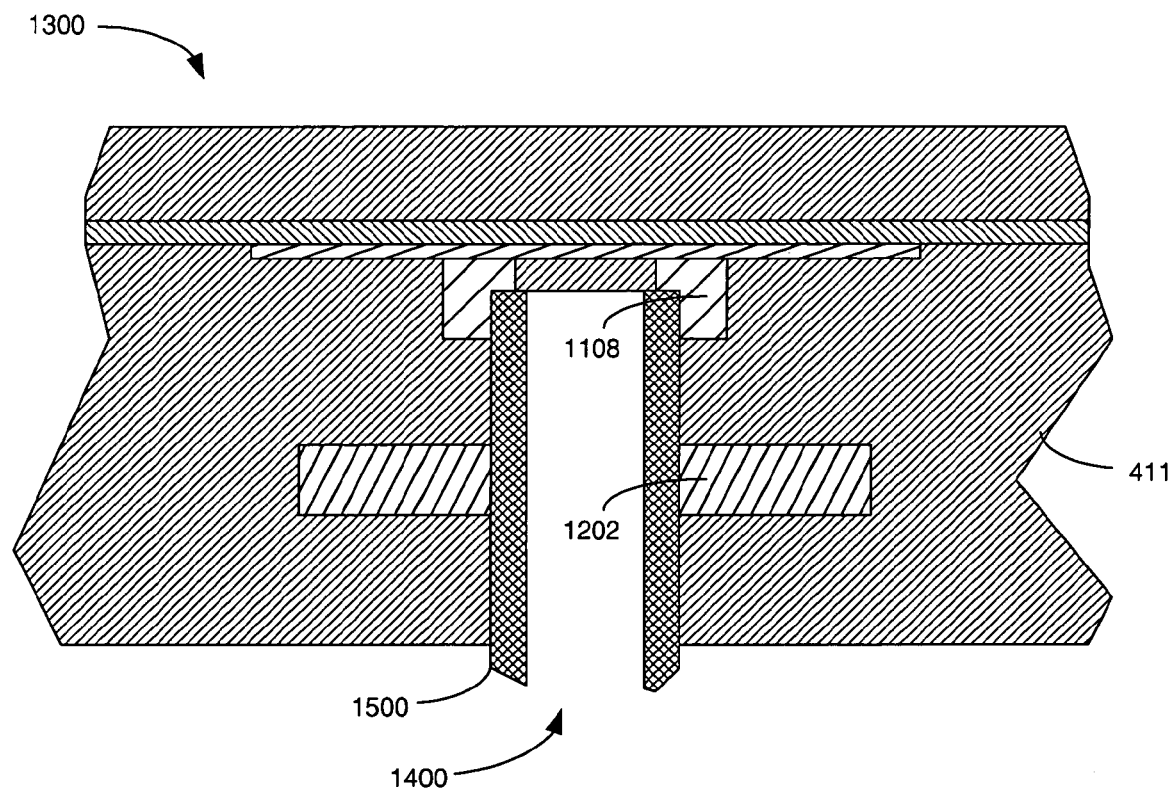

FIG. 15 shows the substrate support 1300 after a conductor 1500 has been inserted into the opening 1400. In this particular embodiment, the conductor 1500 is hollow for reduced thermal conduction. The conductor 1500 is preferably brazed to the substrate support 1300 within the opening 1400. Brazing to the substrate support 1300 can include brazing to the contact 1108 and the bushing 1202.

It will be appreciated that the method of making the substrate support 1300 advantageously does not require precise alignment of the various components. For example, the bushing preform 1202 does not have to be precisely aligned with the contact 1108 because the opening 1400 is machined through the bushing preform 1202 after the substrate support 1300 has been otherwise assembled. Likewise, it can be seen that the opening 1400 and the contact 1108 need not be perfectly coaxial. Good conduction simply requires that the opening 1400 intersect a substantial portion of the contact 1108 so that the conductor 1500 makes substantial contact with the contact 1108.

Figure 16:
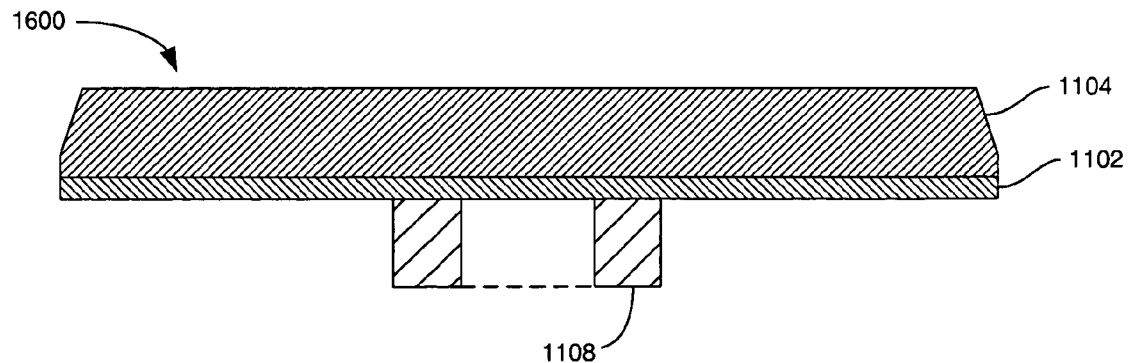
FIGS. 16 and 17 show manufacturing steps for producing a susceptor according to another exemplary embodiment of the present invention.
Figure 17:
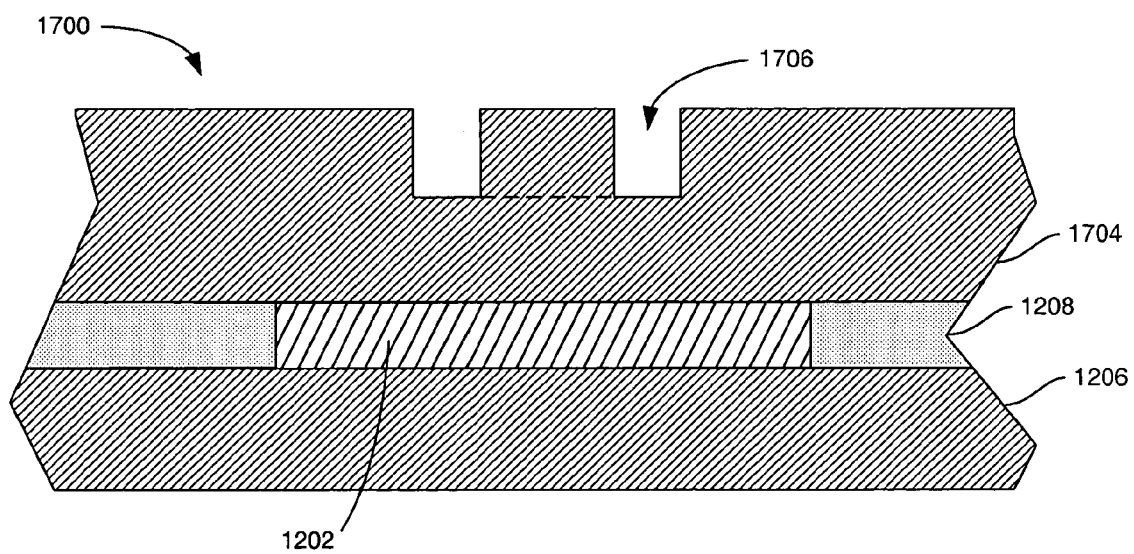

FIGS. 16 and 17 show exemplary alternative manufacturing steps for producing a susceptor of the present invention. In FIG. 17 a second plate 1700 is produced. The second plate 1700 is made by placing a bushing preform 1202 between second and third layers 1704 and 1206 of an electrically insulating material, such as a ceramic like AlN. The space around the bushing preform 1202 is filled with a powder 1208 of the electrically insulating material and the entire assembly is sintered or hot-pressed to form the second plate 1700. A contact opening 1706, shaped like a contact 1108 (FIG. 16), is then machined into the second layer 1704 of the second plate 1700.

An assembly 1600, shown in FIG. 16, is then mated with the second plate 1700. Specifically, the contact 1108 is fitted into the contact opening 1706, a conductive element 1102 is placed over the second layer 1704 and the contact 1108, and a first layer 1104 is placed over the conductive element 1102, and the entire assembly is sintered or hot-pressed together. In embodiments that include a conductive spreader (not shown) within the assembly 1600, the contact opening 1706 can include a corresponding recess for the conductive spreader. It will also be appreciated that the contact opening 1706 can be filled with a sinterable metal powder rather than the contact 1108, and in these embodiments, the contact 1108 is formed by the sintering of the metal powder.

It will be appreciated that still other manufacturing variations are possible. For example, a bushing opening analogous to contact opening 1706 and matching the shape of the bushing preform 1202 can be machined into either the backside of the second layer 1704 or into the topside of the third layer 1206. The bushing preform 1202 is placed into the bushing opening, thus eliminating the need for the layer of metal powder. Additional plates that include additional conductive elements and the components for their respective electrical connections can also be added.

Figure 18:
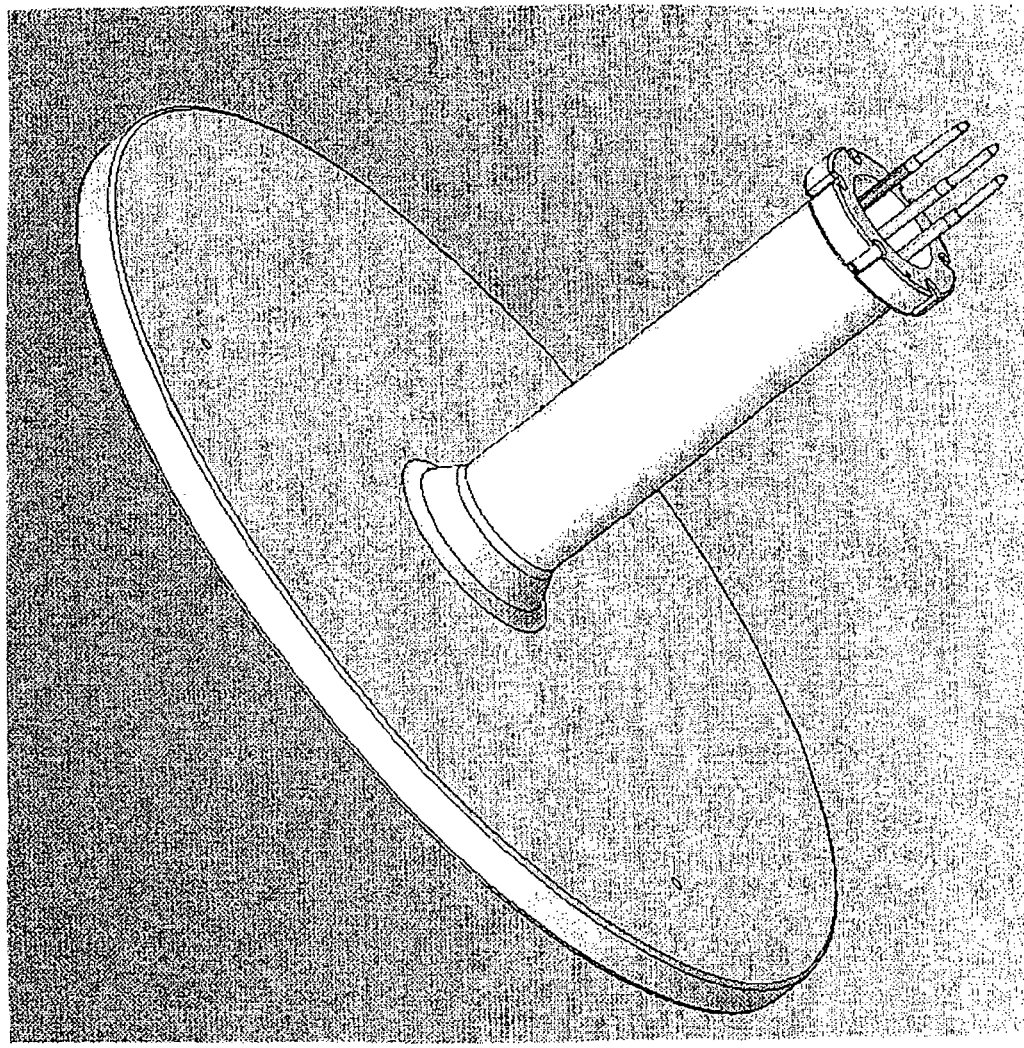
FIG. 18 shows a perspective view of a completed susceptor according to an exemplary embodiment of the present invention.

Once the substrate support 404 (FIG. 4) has been fabricated, the support shaft 406 (FIG. 4) can be joined to the substrate support 404 to complete the susceptor 400 (FIG. 4). The conductor 1500 can then be bonded into the opening 1400 (FIG. 15). FIG. 18 shows a perspective view of a completed susceptor 400.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A substrate support for a susceptor for use in a processing chamber, the substrate support comprising:
   an insulating body;
   a conductive element disposed within the insulating body;
   a contact disposed within the insulating body and in electrical communication with the conductive element; and
   a bushing disposed within the insulating body such that the contact is disposed between the bushing and the conductive element, the bushing comprising a plate member with a bore therethrough.

2. The substrate support of claim 1 wherein the insulating body is formed of a ceramic.

3. The substrate support of claim 1 wherein the conductive element comprises a heating element.

4. The substrate support of claim 1 wherein the conductive element comprises a RF grid.

5. The substrate support of claim 1 wherein the conductive element comprises an electrostatic electrode.

6. The substrate support of claim 1 wherein the contact comprises a cylinder.

7. The substrate support of claim 1 wherein the contact comprises a ring.

8. The substrate support of claim 1 wherein the contact comprises a conductive material with a coefficient of thermal expansion similar to that of the substrate support.

9. The substrate support of claim 8 wherein the conductive material includes molybdenum.

10. The substrate support of claim 8 wherein the conductive material includes tungsten.

11. The substrate support of claim 1 wherein the contact is diffusion bonded to the conductive element.

12. The substrate support of claim 1 wherein the bushing comprises a conductive material with a coefficient of thermal expansion similar to that of the substrate support.

13. The substrate support of claim 12 wherein the conductive material includes molybdenum.

14. The substrate support of claim 12 wherein the conductive material includes tungsten.

15. The substrate support of claim 1 wherein the bushing comprises a shape that is non-circular.

16. A susceptor for use in a processing chamber, the susceptor comprising:
   a substrate support including
      an insulating body;
      a conductive element disposed within the insulating body,
      a contact disposed within the insulating body and in electrical communication with the conductive element, and
   a bushing disposed within the insulating body such that the contact is disposed between the bushing and the conductive element, the bushing comprising a plate member with a bore therethrough;
   a support shaft coupled to the substrate support; and
   a conductor in electrical communication with the contact of the substrate support and extending through both the bushing and the support shaft.

17. The susceptor of claim 16 wherein the conductor is brazed to the contact.

18. The susceptor of claim 16 wherein the conductor is disposed through the bore in the bushing.

19. The susceptor of claim 18 wherein the conductor is brazed to the bushing.

20. The susceptor of claim 18 wherein the conductor is further brazed to the contact.

* * * * *

UNITED STATES PATENT AND TRADEMARK OFFICE
CERTIFICATE OF CORRECTION

| | | |
|---|---|---|
| PATENT NO. | : 7,098,428 B1 | Page 1 of 1 |
| APPLICATION NO. | : 11/044153 | |
| DATED | : August 29, 2006 | |
| INVENTOR(S) | : Brent Elliot et al. | |

It is certified that error appears in the above-identified patent and that said Letters Patent is hereby corrected as shown below:

On Title Page, Item (60) of the issued patent, "Provisional application No. 60/542, 175, filed on Apr. 4, 2004." should read --- --Provisional application No. 60/542,175, filed on February 4, 2004.--

Signed and Sealed this

Twelfth Day of December, 2006

JON W. DUDAS
*Director of the United States Patent and Trademark Office*